United States Patent [19]

Devaud-Pledran et al.

[11] Patent Number: 5,544,193
[45] Date of Patent: Aug. 6, 1996

[54] VERTICAL CAVITY LASER OF LOW RESISTIVITY

[75] Inventors: Benoît Devaud-Pledran; Slimane Loualiche, both of Lannion, France

[73] Assignee: France Telecom, Paris, France

[21] Appl. No.: 166,528

[22] Filed: Dec. 14, 1993

[30] Foreign Application Priority Data

Dec. 15, 1992 [FR] France .................... 92 15090

[51] Int. Cl.$^6$ ........................................ H01S 3/18
[52] U.S. Cl. ................................. 372/96; 372/99
[58] Field of Search ..................... 372/45, 96, 46, 372/99

[56] References Cited

U.S. PATENT DOCUMENTS

| | | | |
|---|---|---|---|
| 4,140,367 | 2/1979 | Makuch et al. | 385/59 X |
| 4,699,458 | 10/1987 | Ohtsuki et al. | 385/59 X |
| 4,949,350 | 8/1990 | Jewell et al. | 372/45 |
| 5,012,486 | 4/1991 | Luryi et al. | 372/45 |
| 5,054,879 | 10/1991 | Brown | 385/59 |
| 5,097,523 | 3/1992 | Marie | 385/59 |
| 5,170,407 | 12/1992 | Schubert et al. | 372/96 |
| 5,208,820 | 5/1993 | Kurihara et al. | 372/45 |
| 5,363,393 | 11/1994 | Vomi et al. | 372/96 |
| 5,386,486 | 1/1995 | Fan et al. | 385/59 |
| 5,392,307 | 2/1995 | Sugiyami et al. | 372/96 |

FOREIGN PATENT DOCUMENTS

| | | | |
|---|---|---|---|
| 0199085 | 9/1987 | Japan | 372/96 |
| 5343739 | 12/1993 | Japan . | |

OTHER PUBLICATIONS

Tiwari et al., "*Empiricalfit to Band Discontinuities and Barrier Heights in III–V Alloy Systems*", Applied Physics Letters, 60(5) Feb. 3, 1992 pp. 630–635.

Peters et al., "Bandgap Engineered Digital Alloy Interaces. . ." Appl. Phys. Lett. 63(25) Dec. 20, 1993 pp. 3411–3413.

IEEE Photonics Technology Letters vol. 2, No. 7, Jul. 1990, New York, US pp. 456–458, XP149742; Y. H. Wang et al., GaAs/AlGaAs Multiple Quantum Well GRIN–SCH Vertical Cavity Surface Emitting Laser Diodes p. 456, colonne de gauche, ligne 27–colonne de droite, line 12; figure 1.

Electronics Letters vol. 25, No. 17, Aug. 17, 1989, Stevenage, GB pp. 1159–1160, XP53994 K. Tai et al., High-Reflectivity AlasO.52SbO.48/GaInAs(P) Distributed Bragg Mirror on InP Substrate for 1.3–1.55um Wavelengths.

Patent Abstracts of Japan, vol. 14, No. 312 (E–948) Jul. 5, 1990 & JP–A–02 101 751 (Fujitsu) Apr. 13, 1990.

Applied Physics Letters vol. 59, No. 9, Aug. 26, 1991, New York, US pp. 1011–1012, XP233713 W. Kowalsky, J. Mahnss Monolithically Integrated InGaAlAs Dielectric Reflectors for Vertical Cavity Optoelectronic Device p. 1011, colonne de droite, ligne 17–p. 1012, colonne de gauche, ligne 10, figure 1.

IEEE Photonics Technology Letters vol. 4, No. 10, Oct. 1992, New York, US pp. 1084–1086, XP316523 C. S. Shim et al., Electrical and Optical Properties of Deep–Red Top-–Surface–Emitting Lasers p. 1086, colonne de gauche, ligne 24–colonne de droite, line 15.

Choa, F. S. et al.,"High reflectivity 1.55 micrometer InP/ InGaAsP Bragg mirror grown by chemical beam epitaxy", A ppl. Phys. Lett. 59, No. 22, Nov. 25, 1991, pp. 2820–2822.

*Primary Examiner*—Rodney B. Bovernick
*Assistant Examiner*—Robert McNutt
*Attorney, Agent, or Firm*—Blakely, Sokoloff, Taylor & Zafman

[57] ABSTRACT

A vertical emission laser structure comprising an active region between stacks of layers forming Bragg reflection mirrors respectively of the n-type and of the p-type, wherein: the stacks of layers are formed by different pairs of materials in the n-type mirror and in the p-type mirror; the pair of materials constituting the n-type mirror comprises materials having a conduction band gap that is narrow or even non-existent; and the pair of materials constituting the p-type mirror comprises materials having a valance band gap that is narrow, or even non-existent.

11 Claims, 1 Drawing Sheet

VERTICAL CAVITY LASER OF LOW RESISTIVITY

The present invention relates to the field of laser structures.

BACKGROUND OF THE INVENTION

Modern crystal growth techniques have made it possible to implement a very wide range of laser structures.

One such laser structure that has been implemented recently is referred to as a "vertical cavity laser".

Such vertical cavity lasers have given rise to literature that is very abundant.

As shown diagrammatically in accompanying FIG. 1, the essential features of vertical cavity lasers generally comprise an active recombination region 10 surrounded on either side by confinement regions 20 and 22, themselves placed between mirror-forming zones 30 and 32.

The bottom mirror-forming zone 32 is placed on a substrate 42, while the top mirror-forming zone 30 receives a contact layer 40 for injection purposes.

Proper operation of such structures relies on making good quality mirrors 30 and 32 above and below the active portion 10 of the component.

The most efficient way of making such mirrors 30 and 32 is to make a repeated stack of two transparent layers having different refractive indices, with each layer being of thickness equal to $\lambda/4$.

In FIG. 1, reference 50 designates the vertical upwards emission obtained through the mirror 30, and reference 52 designates the vertical downwards emission obtained through the mirror 32.

Reference may usefully be made to the document by J. L. Jewell, J. P. Harbison, A. Sheer, Y. H. Lee, and L. T. Florez in IEEE J. Quantum Electron QE-27, p. 1332–1346 (1991) for an outline description of such a laser structure corresponding to FIG. 1.

Reference may also be made to the document by M. Shimada, T. Asaka, Y. Yamasaki, H. Iwano, M. Ogura, and S. Mukai in Appl. Phys. Lett., 57, p. 1289–1291 (1990) for a more complete description of a real laser, as shown in FIG. 2.

This type of mirror formed on a stack of transparent layers is known by the term "Distributed Bragg Reflector", commonly abbreviated to DBR.

Such vertical emission laser structures comprising Bragg reflection mirrors are particularly easy to make out of materials based on GaAs, since layers of AlAs and of AlGaAs containing about 20% Al present refractive indexes that are sufficiently different and they are easy to grow epitaxially one on another.

Structures of this type have been made in numerous configurations.

Nevertheless, there remains the difficulty of the high electrical contact resistance of the reflecting layers 30 and 32.

This high contact resistance is related to band discontinuities at each of the interfaces, which discontinuities slow down the passage of charge carriers.

Various solutions have been envisaged to attempt to remedy this difficulty: for example by making transition layers in a variable period superlattice, or by incorporating layers of alternating dopants to constitute interface dipoles that limit discontinuity.

It will be observed that in the vertical emission laser structure shown in FIG. 2, the p-type contact does not pass via a Bragg mirror in order to minimize the resistance of the device.

All of these modifications do indeed provide improvements, but they do not lead to major changes since the internal electrical resistance of the device remains very high.

On this point, reference may be made in particular to the document by J. L. Jewell, J. H. Lee, A. Scherer, S. L. McCall, and N. A. Olsson in Opt. Eng., 29, p. 210–214 (1990).

In contrast, when the wavelengths of interest are for optical telecommunications, i.e. 1.3 µm or 1.55 µm, it is necessary to use components on a substrate 42 made of InP.

Under such circumstances, the drawbacks of the GaAs system are conserved, and there are two further difficulties. Firstly since the wavelength is longer, the layers must be made thicker.

Secondly, the differences in refractive index are smaller so it is therefore necessary to make a stack comprising a larger number of layers 32 in order to obtain a satisfactory reflection coefficient.

By way of example, W. Tsang was able to obtain a good quality DBR on InP only by using a total thickness of 11 µm.

That laser is described in the publication by F. S. Choa, K. Tai, W. T. Tsang, and S. N. G. Chu, in Appl. Phys. Lett., 59, p. 2820–2822 (1991).

FIG. 3 shows the reflectivity, as measured at three different positions along a wafer, of a DBR made up of 45 successive periods of InP/InGaAsP as proposed by W. Tsang.

OBJECTS AND SUMMARY OF THE INVENTION

The present invention now has the object of improving existing structures.

According to the present invention, this object is achieved by a vertical emission laser structure comprising an active region between stacks of layers forming Bragg reflection mirrors respectively of the n-type and of the p-type, wherein:

the stacks of layers are formed by different pairs of materials in the n-type mirror and in the p-type mirror;

the pair of materials constituting the n-type mirror comprises materials having a conduction band gap that is narrow or even non-existent; and the pair of materials constituting the p-type mirror comprises materials having a valance band gap that is narrow, or even non-existent.

According to an advantageous further characteristic of the present invention, the pair of materials constituting the n-type mirror comprises materials having a wide valance band gap.

According to another advantageous characteristic of the present invention, the pair of materials constituting the p-type mirror comprises materials having a wide conduction band gap.

According to another advantageous characteristic of the present invention, the pairs of materials respectively making up each of the stacks of layers have respective refractive index differences greater than 0.20.

According to another advantageous characteristic of the present invention, the number of layers making up each stack is adapted to define reflectivity that is greater than 80%, and preferably greater than 90%.

According to another advantageous characteristic of the present invention, the number of layers used for each stack is less than 20.

As explained below, this structure proposed in the context of the present invention makes it possible to remedy the major drawbacks of the prior art.

Other characteristics, objects, and advantages of the present invention appear on reading the following detailed description which relates to a preferred implementation of the present invention.

MORE DETAILED DESCRIPTION

Figure 1:
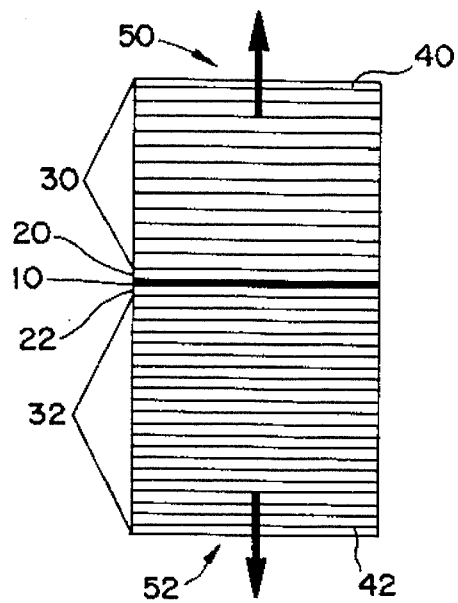
FIG. 1 is a diagrammatic vertical section through a conventional prior art vertical emission laser.
Figure 2:
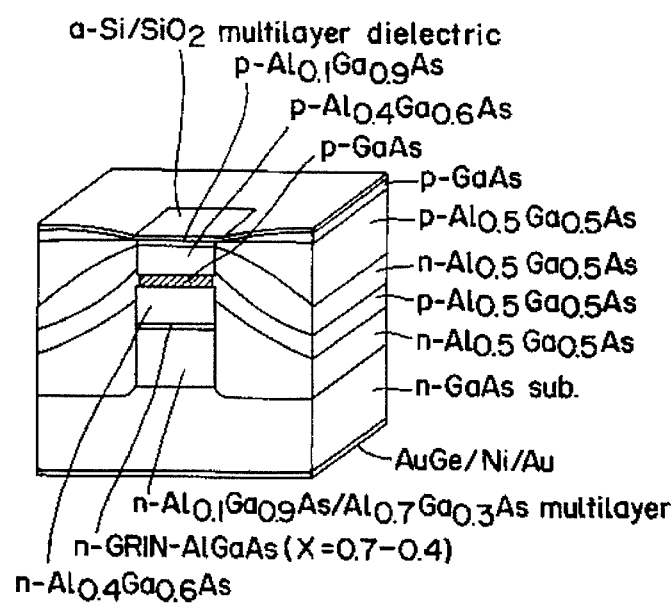
FIG. 2 is a fragmentary exploded perspective view of a particular embodiment of such a prior art vertical emission laser structure.
Figure 3:
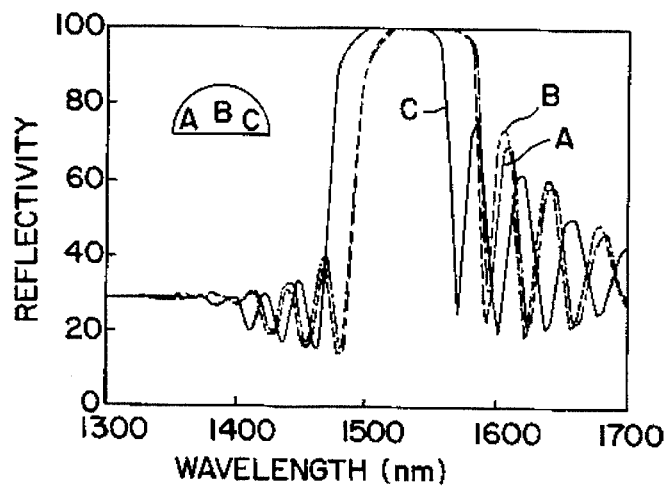
FIG. 3 shows the reflectivity of a prior mirror as a function of wavelength, the mirror comprising a DBR having 45 successive $\lambda/4$ repetitions of InP/InGaAsP.

The laser structure of the present invention is made by epitaxially growing successive different layers on a substrate 42 of InP in the manner known in principle in the prior art and as shown diagrammatically in FIG. 1.

More precisely, in the context of the present invention, the following are deposited in succession on the substrate 42: pairs of n-type Bragg mirror-forming layers 32, a confinement layer 22, the active layer 10, a second confinement layer 20, and a stack of p-type Bragg mirror-forming layers 30, followed by an injection layer 40.

According to an essential characteristic of the present invention, as specified above, the stacks of layers 30 and 32 are formed by different pairs of materials in the n-type mirror and in the p-type mirror.

More precisely, the pair constituting the n-type mirror 32 is made of materials that have a narrow conduction band gap, or even no conduction band gap, whereas the pair constituting the p-type mirror 30 comprises materials having a narrow valence band gap, or even no valance band gap.

According to a preferred further characteristic, as mentioned above, in order to form a barrier to the injected holes and electrons beyond the active zone 10, the pair constituting the n-type mirror has a wide valence band gap, whereas, conversely, the pair constituting the p-type mirror is formed of materials that possess a wide conduction band gap.

In addition, in the context of the invention, pairs of materials are proposed that match the lattice parameter of the InP substrate 42.

In a particularly advantageous embodiment, the n-type mirror is made of the following pair of materials both of which match the lattice parameter of the InP substrate:

$Al_{0.48}In_{0.52}As/GaAs_{0.51}Sb_{0.49}$

The material $Al_{0.48}In_{0.52}As$ has a forbidden band gap of 1.5 eV and a refractive index of 3.20.

The material $GaAs_{0.51}Sb_{0.49}$ has a forbidden band gap of 0.8 eV and a refractive index of 3.75.

Both of the materials $Al_{0.48}In_{0.52}As$ and $GaAs_{0.51}Sb_{0.49}$ have a conduction band gap of 10 meV.

In the context of the present invention, the p-type mirror 30 is made of the following pair of materials, both of which match the lattice parameter of the InP substrate:

$AlAs_{0.51}Sb_{0.49}/Al_{0.48}In_{0.52}As$

The material $Al_{0.48}In_{0.52}As$ has a forbidden band gap of 1.5 eV and a refractive index of 3.20.

The material $AlAs_{0.51}Sb_{0.49}$ has a forbidden band gap of 1.65 eV and a refractive index of 3.40.

Both of the above materials $AlAs_{0.51}Sb_{0.49}$ and $Al_{0.48}In_{0.52}As$ have zero valance band gap.

By using the two above-specified pairs of materials, it is possible to form n-type Bragg mirrors using a stack of layers of $Al_{0.48}In_{0.52}As$ that are 1,172 Å thick and of $GaAs_{0.51}Sb_{0.49}$ that are 1,000 Å thick.

To make p-type Bragg mirrors, a stack can be made having layers of $Al_{0.48}In_{0.52}As$ that are 1,172 Å thick and of $AlAs_{0.51}Sb_{0.49}$ that are 1,103 Å thick.

The present invention thus makes it possible to reduce the number of layers required for making an n-type mirror from 45 to 12, i.e. to reduce the total thickness from 11 µm to 3 µm.

Similarly, the resistance of the p-type layer is reduced from 100 ohms to about 3 ohms.

Thus, it will be understood that the present invention makes it possible simultaneously to reduce the internal electrical resistance of the laser structure and to reduce its total thickness.

Naturally, the present invention is not limited to the particular embodiment described above, but extends to any variant within the spirit of the invention.

We claim:

1. In a vertical emission laser structure comprising an active region between stacks of layers forming Bragg reflection mirrors respectively of the n-type and of the p-type, a structure wherein:

the stacks of layers are formed by different pairs of materials in the n-type mirror and in the p-type mirror, the pair of materials constituting the n-type mirror comprises materials having a conduction bang gap no greater than 10 meV and a wide valance band gap, the pair of materials constituting the p-type mirror comprises materials having zero valance band gap and a wide conduction band gap.

2. A laser structure according to claim 1, wherein the pairs of materials respectively making up each of the layers have respective refractive index differences greater than 0.20, and the number of layers in each stack is less than 20.

3. A laser structure according to claim 1, wherein the number of layers making up each stack is adapted to define reflectivity that is greater than 80%.

4. A laser structure according to claim 1, comprising a substrate of InP, and wherein each of the materials used in the Bragg mirror-forming stacks matches the lattice parameter of the InP substrate.

5. A laser structure according to claim 1, wherein the number of layers making up each stack is adapted to define reflectivity that is greater than 90%.

6. A laser structure comprising an active region between stacks of layers forming Bragg reflection mirrors respectively of the n-type and of the p-type, wherein;

the stacks of layers are formed by different pairs of materials in the n-type mirror and in the p-type mirror, the pair of materials constituting the n-type mirror comprises materials having at most a narrow conduction band gap; and the pair of materials constituting the p-type mirror comprises materials having at most a narrow valance band gap, wherein the pair of materials used for the n-type mirror is the following:

$Al_{0.48}In_{0.52}As/GaAs_{0.51}Sb_{0.49}$.

7. A laser structure according to claim 6, wherein the n-type mirror is made up of a stack of layers of $Al_{0.48}In_{0.52}As$ that are 1,172 Å thick and of $GaAs_{0.51}Sb_{0.49}$ that are 1,000 Å thick.

8. A laser structure comprising an active region between stacks of layers forming Bragg reflection mirrors respectively of the n-type and of the p-type, wherein;

the stacks of layers are formed by different pairs of materials in the n-type mirror and in the p-type mirror, the pair of materials constituting the n-type mirror comprises materials having at most a narrow conduction band gap; and the pair of materials constituting the p-type mirror comprises materials having at most a narrow valance band gap, wherein the n-type mirror is made up of a stack of about 12 alternating layers of $Al_{0.48}In_{0.52}As$ and $GaAs_{0.51}Sb_{0.49}$.

9. A laser structure comprising an active region between stacks of layers forming Bragg reflection mirrors respectively of the n-type and of the p-type, wherein;

the stacks of layers are formed by different pairs of materials in the n-type mirror and in the p-type mirror, the pair of materials constituting the n-type mirror comprises materials having at most a narrow conduction band gap; and the pair of materials constituting the p-type mirror comprises materials having at most a narrow valance band gap, wherein the pair of materials used for making the p-type mirror is the following:

$AlAs_{0.51}Sb_{0.49}/Al_{0.48}In_{0.52}As$.

10. A laser structure according to claim 9, wherein the p-type mirror is obtained by a stack of layers of $Al_{0.48}In_{0.52}As$ that are 1,172 Å thick and of $AlAs_{0.51}Sb_{0.49}$ that are 1,103 Å thick.

11. In a vertical emission laser structure comprising an active region between stacks of layers forming Bragg reflection mirrors respectively of the n-type and of the p-type, a structure wherein:

the stacks of layers are formed by different pairs of materials in the n-type mirror and in the p-type mirror, the stacks of layers having respective refractive index differences greater than 0.20, and the number of layers in each stack being less than 20, the number of layers making up each stack being adapted to define reflectivity that is greater than 90%, the structure comprising a substrate InP, and wherein each of the materials used in the Bragg mirror-forming stacks matches the lattice parameter of the InP substrate, the pair of materials constituting the n-type mirror comprises materials having conduction band gap no greater than 10 meV and a wide valance band gap, and the pair of materials constituting the p-type mirror comprises materials having zero valance band gap and a wide conduction band gap.

* * * * *

UNITED STATES PATENT AND TRADEMARK OFFICE
CERTIFICATE OF CORRECTION

PATENT NO. : 5,544,193
DATED : August 6, 1996
INVENTOR(S) : Deveaud-Pledran et al.

It is certified that error appears in the above-identified patent and that said Letters Patent is hereby corrected as shown below:

In the title page, item [19] and [75] Inventors, please delete "Devaud-Pledran" and insert-- Deveaud-Pledran --.

Signed and Sealed this

Twelfth Day of August, 1997

*Attest:*

*Attesting Officer*

BRUCE LEHMAN
*Commissioner of Patents and Trademarks*